(12) United States Patent
Patra et al.

(10) Patent No.: US 9,423,686 B2
(45) Date of Patent: Aug. 23, 2016

(54) MASK FOR MICROLITHOGRAPHY AND SCANNING PROJECTION EXPOSURE METHOD UTILIZING THE MASK

(71) Applicant: Carl Zeiss SMT GmbH, Oberkochen (DE)

(72) Inventors: Michael Patra, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 148 days.

(21) Appl. No.: 14/303,738

(22) Filed: Jun. 13, 2014

(65) Prior Publication Data
US 2014/0377692 A1 Dec. 25, 2014

Related U.S. Application Data

(63) Continuation of application No. PCT/EP2011/074186, filed on Dec. 28, 2011.

(51) Int. Cl.
*G03F 1/68* (2012.01)
*G03F 1/38* (2012.01)
*G03F 7/20* (2006.01)

(52) U.S. Cl.
CPC .. *G03F 1/38* (2013.01); *G03F 1/68* (2013.01); *G03F 7/70058* (2013.01); *G03F 7/70475* (2013.01)

(58) Field of Classification Search
CPC ................................ G03F 1/68; G03F 7/70475
See application file for complete search history.

(56) References Cited

U.S. PATENT DOCUMENTS

| 5,437,946 | A | 8/1995 | McCoy |
| 5,854,671 | A | 12/1998 | Nishi |
| 7,023,524 | B2 | 4/2006 | Van Dijsseldonk et al. |
| 7,588,869 | B2 | 9/2009 | Lee et al. |
| 7,790,337 | B2 | 9/2010 | Misaka |
| 7,964,326 | B2 | 6/2011 | Lee et al. |
| 2002/0054660 | A1 | 5/2002 | Komatsuda et al. |
| 2005/0134818 | A1 | 6/2005 | Van Dijsseldonk et al. |
| 2005/0142458 | A1 | 6/2005 | Lee et al. |

(Continued)

FOREIGN PATENT DOCUMENTS

| CN | 1637594 | 7/2005 |
| CN | 1641482 | 7/2005 |

(Continued)

OTHER PUBLICATIONS

Japanese Office Action, with translation thereof, for JP Appl No. 2014-549373, Oct. 29, 2015.

(Continued)

*Primary Examiner* — Stephen Rosasco
(74) *Attorney, Agent, or Firm* — Fish & Richardson P.C.

(57) ABSTRACT

A mask for microlithography comprises a substrate; a first pattern area on the substrate, the first pattern area comprising a first pattern extending over a first length in a mask scanning direction and a first width in a direction perpendicular to the mask scan direction; and a second pattern area on the substrate adjacent to the first pattern area in the mask scanning direction, the second pattern area comprising a second pattern extending over a second length in the mask scanning direction and a second width identical to the first width in the direction perpendicular to the mask scan direction.

9 Claims, 10 Drawing Sheets

(56) References Cited

U.S. PATENT DOCUMENTS

| | | |
|---|---|---|
| 2007/0184361 A1 | 8/2007 | Misaka |
| 2008/0036986 A1 | 2/2008 | Yamaguchi |
| 2009/0297958 A1 | 12/2009 | Lee et al. |
| 2011/0014551 A1 | 1/2011 | Moriya |

FOREIGN PATENT DOCUMENTS

| | | |
|---|---|---|
| CN | 1967381 | 5/2007 |
| CN | 101013259 | 8/2007 |
| CN | 101122735 | 2/2008 |
| JP | H 07-50247 | 5/1995 |
| JP | H07-283132 | 10/1995 |
| JP | 2001-176773 | 6/2001 |
| JP | 2001-215722 | 8/2001 |
| JP | 2002-353108 | 12/2002 |
| WO | 2009/100856 | 8/2009 |
| WO | 2010/049020 | 5/2010 |

OTHER PUBLICATIONS

Rominger, "Seamless Stitching for Large Area Integrated Circuit Manufacturing," SPIE Proceedings, vol. 922, pp. 188-193, Mar. 2, 1988.

International Search Report and Written Opinion for PCT Appl No. PCT/EP2011/074186, mailed Sep. 25, 2012.

International Search Report issued on Sep. 25, 2012 in the international application No. PCT/EP2011/074186, filed on Dec. 28, 2011, 3 pages.

Chinese Office Action and English translation thereof for corresponding CN Appl. No. 201180076463, 16 pages, dated Jul. 3, 2015.

Fig. 7A
Fig. 7B
Fig. 7C
Fig. 7D
Fig. 7E
Fig. 7

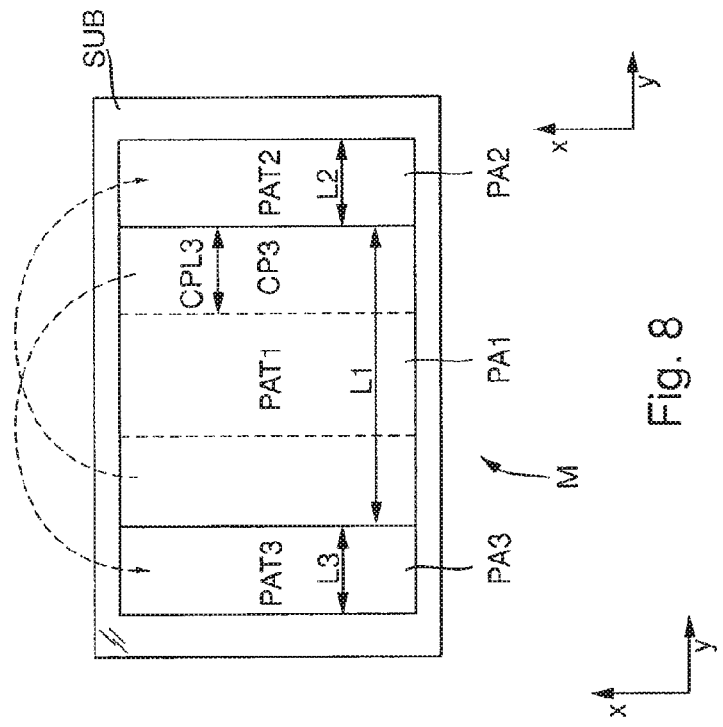
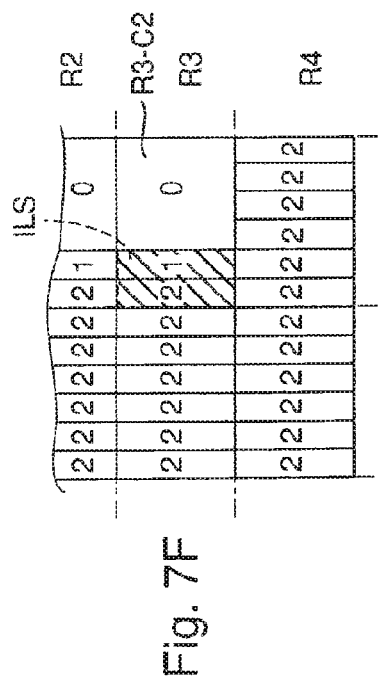
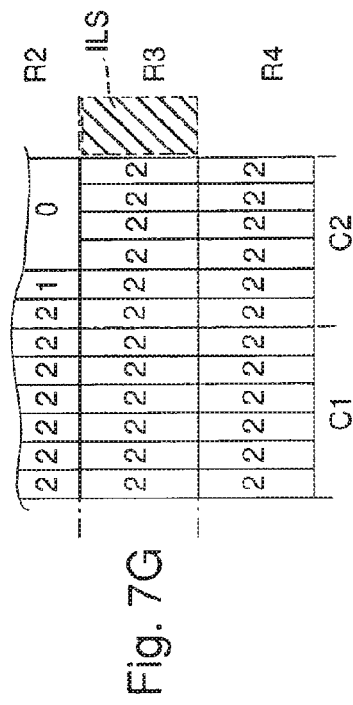

MASK FOR MICROLITHOGRAPHY AND SCANNING PROJECTION EXPOSURE METHOD UTILIZING THE MASK

CROSS REFERENCE TO RELATED APPLICATIONS

This application is a continuation of, and claims benefit under 35 USC 120 to, international application PCT/EP2011/074186, filed Dec. 28, 2011. The content of this application is hereby incorporated by reference.

BACKGROUND

1. Technical Field

The invention relates to a mask for microlithography. The invention further relates to a scanning projection exposure method for exposing a radiation-sensitive substrate, arranged in the region of an image plane of a projection objective, with at least one image of a pattern of a mask arranged in the region of an object plane of the projection objective, wherein the mask for microlithography is utilized. The invention further relates to a projection exposure system suitable for carrying out the method.

2. Description of the Related Art

Microlithography projection exposure methods and systems are currently used to fabricate semiconductor components and other finely patterned components. A microlithographic exposure process involves using a mask (reticle) that carries or forms a pattern of a structure to be imaged. The pattern is positioned in a projection exposure system between an illumination system and a projection objective in a region of the object plane of the projection objective. Primary radiation is provided by a primary radiation source and transformed by optical components of the illumination system to produce illumination radiation directed at the pattern of the mask in an illuminated field. The radiation modified by the pattern passes through the projection objective, which forms an image of the pattern in the image plane of the projection objective, where a substrate to be exposed is arranged. The substrate normally carries a radiation-sensitive layer (photoresist).

When a microlithographic projection exposure system is used in the manufacture of integrated circuits, the mask (reticle) may contain a circuit pattern corresponding to an individual layer of the integrated circuit. This pattern can be imaged onto an exposure area on a semiconductor wafer which serves as a substrate. The exposure area is sometimes referred to as "target area" or "shot area" or as a "die". A die in the context of integrated circuit fabrication is a small rectangular block of semiconducting material, on which a given functional circuit is fabricated. A single wafer typically contains a large number of adjacent dies (exposure areas) which are successively exposed to an image of the pattern. The dies are typically arranged in rows and columns.

A typical conventional mask contains one pattern area which includes one complete pattern to be imaged. A narrow light shielding band may be arranged at the edges of the patterned portion to block unwanted radiation from entering the projection objective. A conventional mask may contain two identical complete patterns (see U.S. Pat. No. 5,854,671, FIG. 16A).

In one class of microlithographic projection exposure systems each exposure area is irradiated by exposing the entire pattern of the mask onto an exposure area at once. Such apparatuses are commonly referred to as wafer steppers.

In alternative exposure systems commonly referred to as step-and-scan apparatus or wafer scanner, each exposure area is irradiated progressively in a scanning operation by moving the mask relative to an illumination beam in the object plane of the projection objective, and simultaneously moving the substrate relative to the projection beam in the conjugate image plane of the projection objective in respective scanning directions. The mask is typically held in place by a mask holder, which is movable in a mask scan direction parallel to the object plane of the projection objective. The substrate is typically held by a substrate holder, which is movable parallel to the image plane. Depending on the design of the projection objective the scanning directions of the mask and the substrate may be parallel to each other or anti-parallel to each other, for example. During the scanning operation, the speed of movement of the mask and the speed of movement of the substrate are interrelated via the magnification ratio (absolute value $|\beta|$) of the projection objective, which is smaller than 1 for reduction projection objectives.

In a scanning exposure system the illumination system is configured to generate an illumination beam that has a slit shaped cross section in the plane where the pattern is situated. The cross section may be rectangular or arcuate (arc shaped), for example. The area which can be illuminated at a given instant of time is denotes as "illumination slit" in the context of this application.

In a scanning operation the illumination system illuminates a slit shaped portion of the pattern at a given time. A length of the illumination slit in the scanning direction is a fraction of the length of an entire pattern to be illuminated in a single scan. The width of the illumination slit in a cross scan direction orthogonal to the scan direction is larger than the length of the illumination slit and not smaller than the width of the pattern on the mask.

A reticle-masking (REMA) device is usually provided in the illumination system to define the effective length and width dimensions of the illumination slit at a given instant of time. Typically, a reticle-masking device comprises two pairs of movable blades, sometimes denoted as REMA blades. A first pair of blades has edges aligned orthogonal or otherwise traverse to the scanning direction. A distance between these edges in the scanning direction determines the effective length of the illumination slit at a given instant in time. The blades of the first pair can be linearly moved in the scan direction independent from each other. A second pair of blades has edges generally transverse to the edges of the first pair. A distance between these edges in the cross scan direction determines the effective width of the illumination slit.

In exposure systems for microlithography operating with radiation in the deep ultraviolet (DUV) or vacuum ultraviolet (VUV) spectral range a preferred location of the reticle masking device is an intermediate field plane in the illumination system optically conjugate to the plane where the mask is situated. An optical imaging system having a given magnification (often between 1:2 and 6:1) is interposed between the reticle-masking device and the mask and images the edges of the blades sharply onto the mask. Alternatively, the blades of the reticle masking device may be arranged directly in front of the mask. This arrangement is sometimes adopted in exposure systems for microlithography operating with radiation in the extreme ultraviolet (EUV) range of the spectrum. EUV systems use reflective masks.

The blades of the first pair of blades play an important role in controlling the dose of radiation energy incident on each particular point the moving substrate in a scanning operation in the manner of a movable shutter mechanism. Before a scanning cycle starts the blades are effectively closed to prevent radiation from falling onto the mask. As the scanning movement of the mask starts the blades open up to a maximum distance, which is the full illumination slit length for a given scanning operation. At the end of the scanning cycle the blades close again to block any undesired radiation from falling onto the mask. The opening movement is performed by the front blade, i.e. the blade in the forward direction of the scanning movement in synchronism with a front edge of the pattern on the moving mask. The closing movement is performed by the rear blade in synchronism with the rear edge of the pattern of the moving mask (see e.g. U.S. Pat. No. 5,854, 671, FIG. 6 and corresponding description). This ensures that each portion of the exposure area is exposed by the same radiation energy dose.

SUMMARY

It is one object of the invention to provide a mask for a step-and-scan projection exposure method and system which allow for high throughput.

It is another object of the invention to provide a step-and-scan projection exposure method and system which allow for high throughput.

To address these and other objects the invention, according to one formulation of the invention, provides a mask for microlithography that includes a substrate; a first pattern area on the substrate, the first pattern area comprising a first pattern extending over a first length in a mask scanning direction and a first width in a direction perpendicular to the mask scan direction; a second pattern area on the substrate adjacent to the first pattern area in the mask scanning direction, the second pattern area comprising a second pattern extending over a second length in the mask scanning direction and a second width identical to the first width in the direction perpendicular to the mask scan direction, wherein the second length is smaller than the first length and the second pattern is identical to a corresponding portion of the first pattern, where the corresponding portion is offset relative to the second pattern by the first length in the mask scan direction and has a length identical to the second length.

According to another formulation the invention provides a scanning projection exposure method for exposing a radiation-sensitive substrate, arranged in the region of an image plane of a projection objective, with at least one image of a pattern of a mask arranged in the region of an object plane of the projection objective. The method comprises: generating an illumination beam that has a slit shaped cross section in the plane where the pattern is situated, wherein effective length and width dimensions of an illumination slit at a given instant of time are controlled by a reticle-masking device provided in an illumination system between a light source and the mask; exposing exposure areas on the substrate progressively in scanning operations by moving the mask relative to the illumination beam in the object plane of the projection objective, and simultaneously moving the substrate relative to a projection beam in the image plane of the projection objective in respective scanning directions; wherein the substrate comprises a first exposure area and a second exposure area adjacent to the first exposure area in the scanning direction, wherein the entire first exposure area and a first portion of the second exposure area adjacent to the first exposure area are exposed in one single continuous first scanning operation in a first scanning direction, and wherein the first scanning operation is stopped before the entire second exposure area is completely exposed so that the second exposure area is only partially exposed.

According to another formulation the invention provides a projection exposure system, which is suitable for carrying out the method. The system comprises: a radiation source emitting radiation from a wavelength band around an operating wavelength; an illumination system receiving the radiation from the radiation source and shaping illumination radiation to form an illumination beam directed onto the pattern of the mask, the illumination system comprising a reticle-masking device configured to define effective length and width dimensions of an illumination slit of illumination radiation incident on the mask at a given instant of time; and a projection objective to project an image of the pattern onto the substrate.

A novel mask for microlithography comprises a substrate; a first pattern area on the substrate, the first pattern area comprising a first pattern extending over a first length in a mask scanning direction and a first width in a direction perpendicular to the mask scan direction; a second pattern area on the substrate adjacent to the first pattern area in the mask scanning direction, the second pattern area comprising a second pattern extending over a second length in the mask scanning direction and a second width identical to the first width in the direction perpendicular to the mask scan direction. The second length is smaller than the first length and the second pattern is identical to a corresponding portion of the first pattern, where the corresponding portion is offset relative to the second pattern by the first length in the mask scan direction and has a length identical to the second length.

Typically, the patterned portion of the mask is larger in the scanning direction than the patterned portion of a conventional mask carrying the same pattern. Manufacturing cost for a novel mask may therefore be higher than for a corresponding conventional mask. However, the additional costs are more than compensated by increased throughput made possible by utilizing the mask.

The additional length may be quantified by the length ratio L1/L2, which is a length ratio between the first length and the second length. In some embodiments the conditions 66 mm≤L1≤132 mm and 16 mm≤L2≤32 mm hold for the numerator L1 and the denominator L2 of this ratio, respectively. Preferably the length ratio is in a range from 132/16 to 132/32.

A typical case covered by the above formulation is a mask where the first pattern area contains a single first pattern forming a single complete pattern required to expose a single exposure area (or die). In this case the second pattern, which is structured like a portion (or fraction) of the first pattern, corresponds to an incomplete pattern including only a fraction of pattern elements required to expose a single exposure area.

In exceptional cases the first pattern may be composed of two or more small sized complete patterns aligned periodically in the scanning direction, each complete pattern being suitable to expose one complete exposure area of small size. In those cases the second pattern area could contain a further complete pattern. In those cases a mask according to the present disclosure may be recognized by the overall length L1+L2 of the pattered portions, which is larger than the overall length of patterned portions on conventional masks corresponding to industry standard. Specifically, the condition L1+L2>132 mm will be fulfilled in these cases.

A single second pattern area on one side of the pattern may be sufficient in many cases. Additional degrees of freedom with regard to the required sequence of scanning and stepping operations may be obtained if the mask is provided with a third pattern area on the substrate adjacent to the first pattern area in the mask scanning direction opposite to the second pattern area, where the third pattern area comprises a third pattern extending over a third length in the mask scanning direction and a third width identical to the first width in the direction perpendicular to the mask scan direction. The third length is smaller than the first length and the third pattern is identical to a corresponding portion of the first pattern, where the corresponding portion is offset relative to the third pattern by the first length in the mask scan direction and has a length identical to the third length. Preferably, the second length corresponds to the third length, i.e. L2=L3.

In some embodiments the mask is a reflective mask. The patterned area of the mask may have a reflective coating effective to reflect EUV radiation. The reflective coating may include stacked layers of alternating high refractive index and low refractive index materials, such as Molybdenum/Silicon or Molybdenum/Beryllium bilayers, for example. A reflective mask may also be configured such that incident DUV or VUV radiation is reflected to a high degree.

In other embodiments the mask is a transmission mask, particularly a transmission mask for microlithography using deep ultraviolet (DUV) or vacuum ultraviolet (VUV) radiation. In that case a mask substrate may be made of synthetic quartz (fused silica) or calcium fluoride, for example.

In a scanning projection exposure method for exposing a radiation-sensitive substrate, arranged in the region of an image plane of a projection objective, with at least one image of a pattern of a mask arranged in the region of an object plane of the projection objective, an illumination beam is generated that has a slit shaped cross section in the plane where the pattern of the mask is situated. Effective length and width dimensions of an illumination slit at a given instant of time are controlled by a reticle-masking device provided in an illumination system between a light source and the mask. Exposure areas on the substrate are exposed progressively in scanning operations by moving the mask relative to the illumination beam in the object plane of the projection objective, and simultaneously moving the substrate relative to a projection beam in the image plane of the projection objective in respective scanning directions. The substrate comprises a first exposure area and a second exposure area adjacent to the first exposure area in the scanning direction. (Typically the substrate comprises a large number of exposure areas including many pairs of first and second exposure areas adjacent to each other in the scanning direction). The entire first exposure area and a first portion of the second exposure area adjacent to the first exposure area are exposed in one single continuous first scanning operation in a first scanning direction. The first scanning operation is stopped before the entire second exposure area is completely exposed so that the second exposure area is only partially exposed.

Unlike in conventional scanning exposure methods a single continuous scanning operation is performed to expose more than one single exposure area between the beginning and the end of one single scan. Instead, a second exposure area is also exposed in the same scan, although only partly.

In embodiments the radiation dose is controlled during the first scanning operation so that a radiation dose received in the first portion (of the second exposure area) decreases continuously from the side adjacent to the first exposure area toward a second portion of the second exposure area opposite to the first exposure area according to a first radiation dose profile. Typically the first radiation profile corresponds to a linear gradient of received radiation. Typically, the second portion remains unexposed, i.e. does not receive any exposure radiation, in the first scanning operation.

Preferably, the reticle masking device remains fully opened at full illumination slit length and a light flux on the reticle masking device is stopped at the end of a first scanning operation, so that no further radiation is incident onto the first portion. This makes it possible that any radiation emitted from the light source and incident on the reticle masking device is effectively used to expose the substrate. In other words: light loss can be significantly reduced when compared to conventional methods where the blades of the reticle masking device are opened and closed again at the end of each single scanning operation.

Where a continuous light source is used, the light flux may be stopped by closing a shutter arranged between the light source and the reticle masking device. Alternatively the light source may be shut off temporarily at the end of the first scanning operation. This step does not require any constructional modification in systems using pulsed radiation sources. For example, scanning exposure systems operating in the DUV or VUV or EUV range typically use pulsed radiation sources. A sequence of pulses (burst) at a given pulse rate may be generated during the scanning operation. Emission of pulses may be stopped temporarily after the burst used to expose the first exposure area and the first portion of the second exposure area at the end of the scanning cycle.

A single scanning operation results in a second exposure area which is only partially exposed. The second exposure area may be further exposed in a second scanning operation in a second scanning direction and exposure dose may be controlled during the second scanning operation so that the second exposure area receives a second radiation dose complementary to the radiation dose received in the first scanning operation so that a uniform exposure dose is received in the second exposure area after the second scanning operation is completed. In other words: two separate scanning operations performed at different times are used to expose the second exposure area completely. Depending on the particulars of an overall process the second scanning direction may be directed opposite to the first scanning direction or may be the same direction as the first scanning direction.

Although it would be possible to start the second scanning operation immediately after the end of the first scanning operation it is preferred if one or more intervening scanning operations are performed between the first and second scanning operation. In this case, the second scanning operation on the second exposure area is performed after at least one third scanning operation has been performed on the substrate. The substrate may therefore contain one or more partially exposed exposure areas at a given time during an overall process to expose all required exposure areas of the substrate. Completion of exposure is then accomplished at a later time before the overall process is finished. This temporal and spatial distribution of complete and partial exposure steps contributes to a highly efficient overall process with increased throughput.

Typically, one or more stepping operations are performed between the first and the second exposure. For example, the substrate may be moved in a stepping operation perpendicular to the scanning direction by a length corresponding to a width of the exposure area after the first scanning operation is completed. A new previously unexposed exposure area can thereby be reached prior to the next scanning operation. The sequence of scanning and stepping operations may vary.

A scanning projection exposure system capable of exposing substrates in accordance with the new method and/or by utilizing the novel mask typically comprises: a radiation source capable to emit radiation from a wavelength band around an operating wavelength; an illumination system configured to receive the radiation from the radiation source and to shape illumination radiation to form an illumination beam directed onto the pattern of the mask, and a projection objective to project an image of the pattern onto the substrate. The illumination system comprises a reticle-masking device configured to define effective length and width dimensions of an illumination slit of illumination radiation incident on the mask at a given instant of time. The scanning projection exposure system may be configured and controlled to expose substrates in accordance with the method and mask described above and below.

In some cases a conventional system can be used without constructional modifications. For example, if a reticle stage allows for travel lengths sufficient to utilize a mask of the new type, no modifications are necessary at the reticle stage. Further, no constructive modifications to conventional reticle masking devices are necessary. The new method may be implemented by altering respective portions of the control program governing the operation of the system in operation.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIGS. 7A-7G shows in partial FIGS. 7A to 7G plan views on portions of a substrate surface with rows and columns of exposure areas exposed during operations of a step-and-scan procedure according to an embodiment of the invention;

FIG. 8 shows a schematic plan view of a mask according to a second embodiment of the invention.

DETAILED DESCRIPTION OF THE PREFERRED EMBODIMENTS

Figure 1:
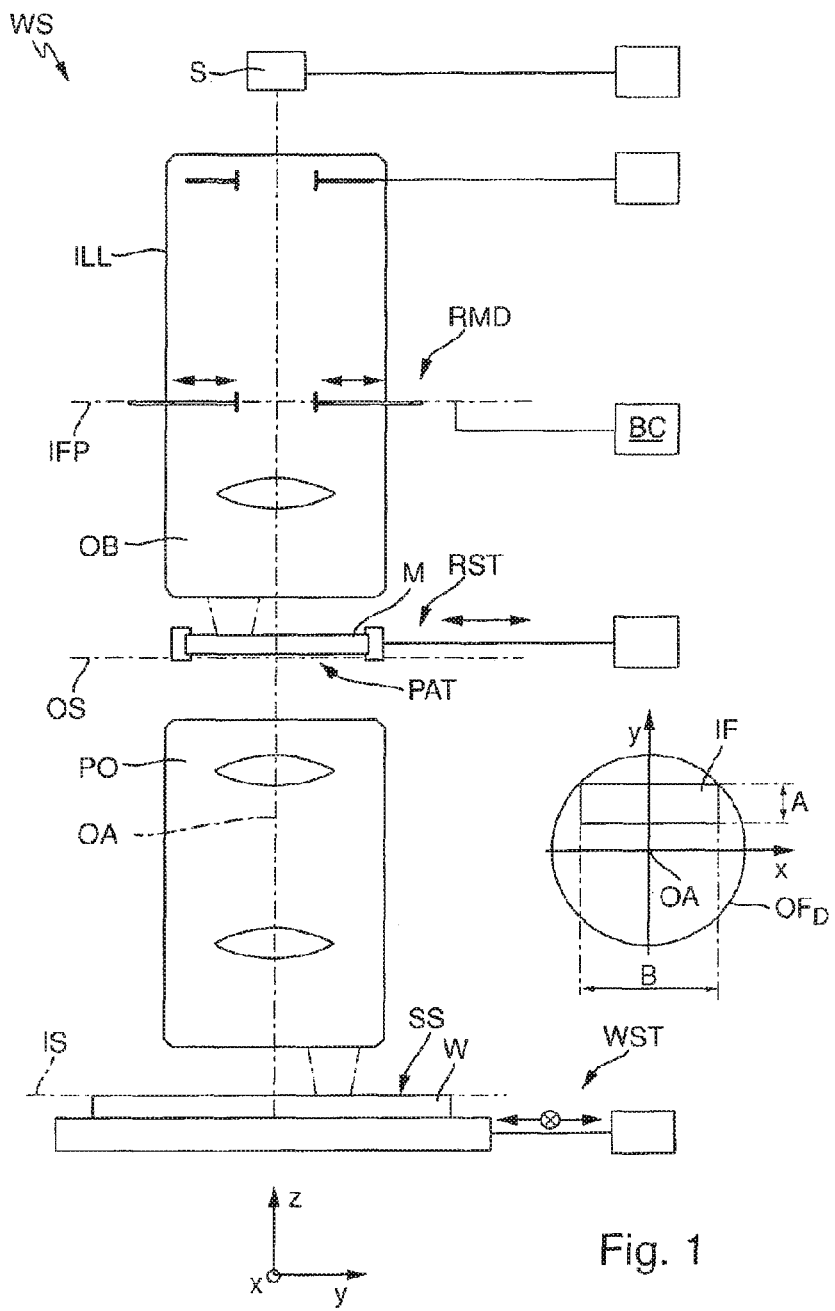
FIG. 1 shows a schematic drawing of an embodiment of a scanning projection exposure system for microlithography having an illumination system which includes a reticle masking device.

FIG. 1 shows schematically a microlithographic projection exposure system in the form of a wafer scanner WS provided for fabricating large scale integrated semiconductor components via projection lithography in a step-and-scan mode.

The projection exposure system comprises a primary radiation source S including an Excimer laser having an operating wavelength of 193 nm. An illumination system ILL arranged optically downstream of the radiation source receives radiation from the radiation source and a homogeneously illuminated illumination field IF in a plane which corresponds to the object plane OS of a projection objective PO arranged optically downstream of the illumination system. The illumination system ILL includes devices for setting different illumination modes, such as conventional on-axis illumination with a variable degree of coherence, off-axis illumination, particularly annular illumination (having a ring shaped illuminated area in a pupil surface of the illumination system), dipole or quadrupole illumination.

A device RST for holding and manipulating a mask M is arranged downstream of the illumination system is in such a way that a pattern PAT formed on the mask lies in the object plane OS of the projection objective PO. Therefore, the object plane may also be denoted as "mask plane" or "reticle plane". The device RST for holding and manipulating the mask—usually referred to as "reticle stage"—contains a mask holder and a scanner drive enabling the mask to be moved parallel to the object plane OS of the projection objective (i.e. perpendicular to the optical axis of projection objective and illumination system) in a scanning direction (Y-direction) during a scanning operation.

The reduction projection objective PO is designed to image an image of a pattern provided by the mask with a 4:1 reduction scale (magnification $|\beta|=0.25$) onto a photosensitive substrate in the form of a wafer W coated with a photoresist layer. Other reduction ratios, e.g. 5:1 or 8:1 are possible.

The wafer W serving as a light-sensitive substrate is arranged in such a way that a macroscopically planar substrate surface SS with the photoresist layer essentially coincides with the image plane IS of the projection objective. The wafer is held by a device WST (wafer stage) comprising a scanner drive in order to move the wafer synchronously with the mask M in parallel with the latter.

As shown schematically in the inset figure of FIG. 1, the illumination system ILL is configured to generate an illumination field IF having a rectangular shape. The size and shape of the illumination field determine the size and shape of the effective object field of the projection objective actually used for projecting an image of a pattern on a mask into the image plane of the projection objective.

The illumination field has a length A parallel to the scanning direction and a width B>A in a cross-scan direction perpendicular to the scanning direction and does not include the optical axis OA (off-axis field) of the projection objective. The dimensions can be defined by an aspect ratio AR=B/A>1. In many embodiments the aspect ratio may be in the range from 2:1 to 10:1, for example. The rectangular effective image field in the image plane has the same aspect ratio, but absolute dimensions scale with the reduction ratio of the projection objective.

The illumination field is inscribed in a circular area $OF_D$ denoted as "design object field" of the objective. In the design object field $OF_D$ all field points of the object plane have an imaging fidelity sufficiently good for the intended lithographic process.

The projection objective PO may include a plurality of schematically indicated lenses (typical numbers of lenses are often more than 10 or more than 15 lenses) and, if appropriate, other transparent optical components. The projection objective may be a refractive projection objective, where all optical elements with optical power are transparent lenses. The projection objective may include at least one powered mirror, such as at least one concave mirror, in addition to lenses so that a catadioptric projection objective is formed. The projection objective may be all reflective (catoptric).

The illumination field IF is an area which could be illuminated. The dimensions of an illumination slit which is actually used in a specific process may not exceed the respective dimensions of the illumination field. An illumination slit smaller than the illumination field may be used.

Figure 2:
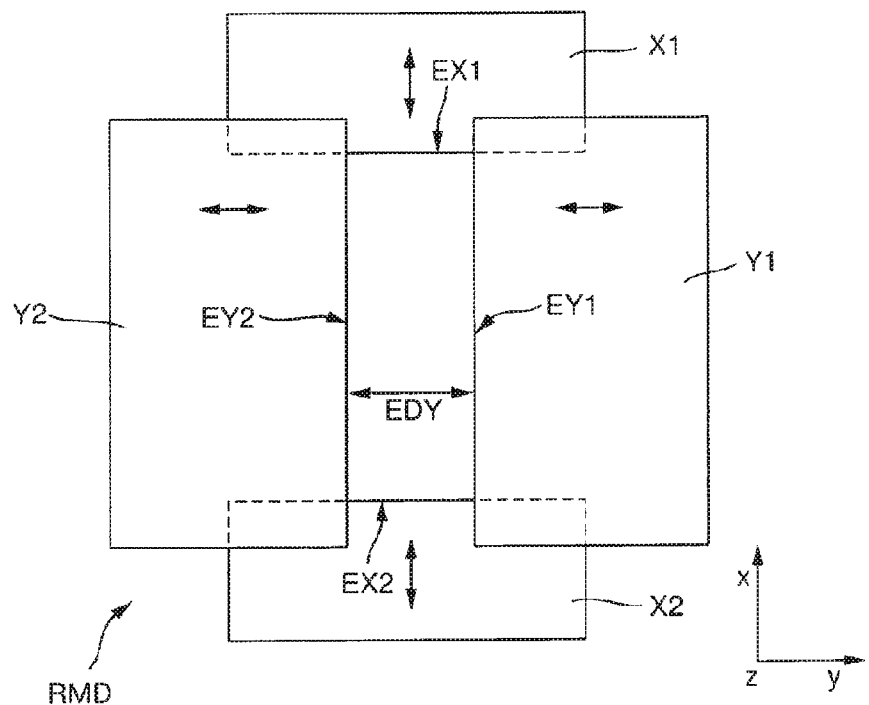
FIG. 2 shows a schematic axial view of an embodiment of a reticle-masking device with movable blades.

A reticle-masking (REMA) device RMD is provided in the illumination system ILL to define the effective length and width dimensions of the illumination slit at a given instant of time. FIG. 2 shows a schematic axial view of an embodiment. The reticle-masking device comprises two pairs of movable opaque (light blocking) blades, which are also referred to as "REMA blades" in this application. A first pair of blades Y1, Y2 has straight blade edges EY1, EY2 aligned orthogonal to the scanning direction (Y-direction). These blades are denoted as "Y-blades" in the following. A distance EDY between the edges of the Y-blades in the scanning direction determines the effective length of the illumination slit at a given instant in time. The blades of the first pair can be linearly moved in the scan direction independent from each other. A second pair of blades X1, X2 (also denoted as "X-blades") has straight edges EX1, EX2 orthogonal to the edges EY1, EY2 of the first pair. A distance between these edges in the cross scan direction (X-direction) determines the effective width of the illumination slit. A blade controller BC controls the movements of the blades. While the X-blades are stationary in a typical scanning operation, the Y-blades may be moved in synchronism with the movement of the mask and the substrate during a scanning operation.

The blades of the reticle masking device RMD are arranged within the illumination system in an intermediate field plane IFP which is optically conjugate to the plane OS where the pattern of the mask is situated. An optical imaging system OB having a given magnification ratio is interposed between the blades of the reticle-masking device and the mask. This objective, sometimes denoted as REMA objective, is configured to image the edges of the blades sharply onto the mask.

The blades Y1, Y2 of the first pair of blades (Y-blades) play an important role in controlling the dose of radiation energy incident on each particular point on the moving substrate in a scanning operation in the manner of a movable shutter mechanism. A conventional mode of operation is now described in detail in connection with FIG. 3.

Figure 3:
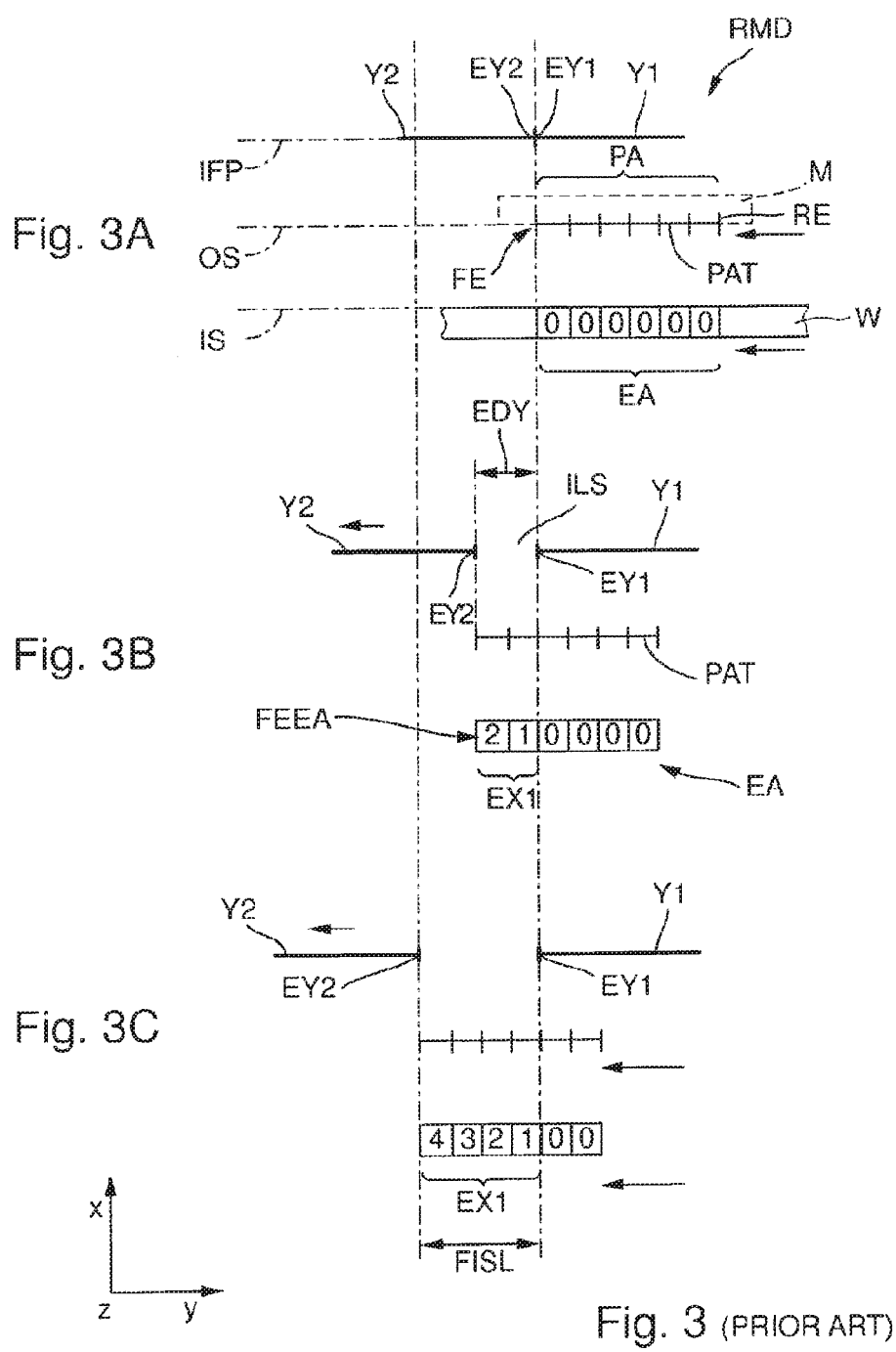
FIGS. 3A-3F shows in 3A to 3F relative positions of the blades of a reticle-masking device, a patterned mask, and the substrate in different phases of a conventional scanning operation.
Figure 3:
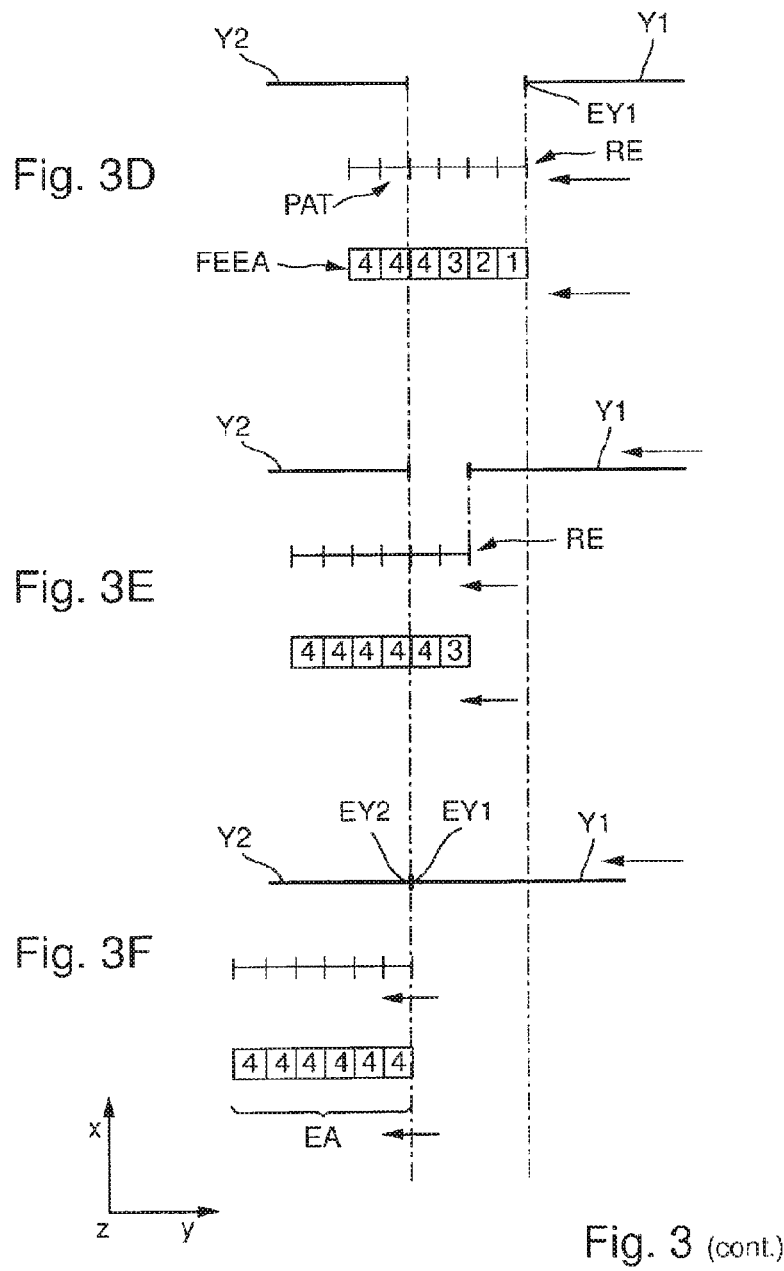

FIG. 3 is a highly schematic drawing showing relative positions of the blades Y1, Y2 of the reticle-masking device RMD, a mask M provided with a pattern PAT in a pattern area PA, and the substrate W to be exposed. The substrate includes a plurality of rectangular exposure areas arranged in mutually orthogonal rows and columns. One exposure area EA on the substrate is schematically shown. The Y-blades Y1, Y2 are arranged in the intermediate filed plane IFP of the illumination system, optically conjugate to the object plane OS of the projection objective. The pattern PAT is arranged in the object plane OS on the side of the mask facing the projection objective. The substrate surface SS is arranged in the image plane IS of the projection objective, optically conjugate to the object plane OS.

In order to facilitate understanding of the scanning process the optical imaging system OB which images the blades of the reticle-masking device onto the mask, and the projection objective, which images the pattern of the mask onto the substrate are not shown in FIG. 3. Also, the simplified representation does not show that an optical imaging system disposed between the intermediated field plane IFP and the object plane OS normally reverses the movement directions of blades and mask. Further the simplified representation omits the effect of the pro-projection objective, which typically generates a demagnified image of the pattern on the substrate, and which often requires that the mask and the substrate are moved in anti-parallel directions during scanning operation.

As a consequence of the simplification, both the mask M and the substrate W move from the right hand side to the left hand side of the figure during a scanning operation parallel to the Y-direction.

Note that the simplified drawings in FIG. 3 shows the blades of the reticle-masking system in front of the mask when viewed in the radiation propagation direction so that a direct projection of the illumination slit falls onto the mask. In this case the illumination slit is bounded by the shadows of the blade edges (compare FIG. 9). If there is imaging objective between the plane of the reticle-masking device and the mask, an image of the blade edges falls onto the mask. It is intended to cover both cases in the explanations in connection with FIG. 3.

The pattern PAT on the mask M includes all structures which have to be imaged onto the exposure area EA in a single rectangular pattern area PA delimited by a straight front edge FE and a straight rear edge RE orthogonal to the scanning direction and straight side edges (not shown) parallel to the scanning direction.

Indicated in broken lines is the full illumination slit length FISL, which is the maximum length of the illumination slit ILS in Y-direction during the scanning operation.

Before a scanning cycle starts the blades Y1, Y2 of the first pair are effectively closed so that the distance EDY between the opposing blade edges EY1 and EY2 is zero or close to zero such that no radiation can pass through between the blade edges towards the mask. As the scanning movement of the mask in the scanning direction starts, the front edge FE of the pattern PA comes into a position in alignment with the position of the blade edges of the closed slit. This situation is shown in FIG. 3A.

As the mask moves continuously forward in the mask scanning direction (to the left) the illumination slit starts to open (FIG. 3B). To this end, the blade controller BC initiates movement of the second Y-blade Y2 in the scanning direction such that the blade edge EY2 of the Y-blade Y2 stays in alignment with the front edge FE of the pattern. At the same time, the opposite Y-blade Y1 remains stationary. As a result, the illumination slit opens and the edge distance EDY increases with a speed proportional to the movement speed of the mask in the scanning direction.

Since the Y-blade Y2 on the left hand side moves with the pattern and in front of the pattern in the scanning direction, this blade is also denoted as "leading blade Y2", and the corresponding edge EY2 is denoted as "leading edge". On the other hand, the opposite edge EY1 remains stationary at first, and therefore lags behind in the scanning direction. Therefore, this blade may be denoted as the "following blade Y1" comprising the "following edge EY1".

FIG. 3B shows a situation where the illumination slit ILS has opened up to a fraction of the full illumination slit length FISL so that illumination radiation falls onto the mask and is projected through the projection objective onto the substrate. At the instant of time shown in FIG. 3B an exposed portion EX1 has already received some exposure radiation. The exposure dose received by each unit area in the exposed portion is generally proportionally to the length of the time interval in which the unit area has received radiation. Therefore, portions closest to the front edge FEEA of the exposure area EA have received more radiation than portions further away from the front edge. The amount of radiation already received by portions in the exposure area is schematically indicated by integer numbers "0" to "4" in FIG. 3. Higher numbers generally refer to a higher radiation doses already received, zero (0) indicates unexposed portions. The integer numbers in the figures correspond to the radiation dose received after the respective exposure, i.e. before the substrate moves further on. Other than the schematic figure suggests there is a continuous gradient of received radiation dose in the scanning direction between the front edge FEEA and the portion of the exposure area which is in alignment with following edge EY1, except for small dose quantization effects if a pulsed light source is utilized.

The leading blade is further moved in synchronism with the mask up to a final position where the distance between the leading edge EY2 and the following edge EY1 corresponds to the full illumination slit length FISL in the Y-direction. This situation is shown in FIG. 3C. At this instant of time, the region near the front edge FEEA of the exposure area has received even more exposure radiation. At the same time, the exposed portion EX1 on the substrate has increased in size in the Y-direction. At this time, there is still some portion of the exposure area EA which has not yet received any exposure radiation so that the radiation dose is still zero (0).

The forward movement of the leading edge EY2 is stopped once the distance EDY to the following edge EY1 corresponds to the full illumination slit length. At this time, there is still some portion of the exposure area which is not exposed. The mask and the substrate are both further moved in the respective scanning directions so that new unexposed portions of the exposure area receive radiation from the illumination slit. FIG. 3D shows the situation at a point in time where the rear edge RE of the pattern PAT is in alignment with the following edge EY1 of the following blade Y1. At this time, each portion of the exposure area EA has received a finite dose of radiation. Portions close to the front edge FEEA have already moved outside of the illumination slit and have received the full required radiation dose (represented by number 4). The actual level of received radiation decreases continuously from the left to the right in the area of the illumination slit.

While the forward movement of the leading edge EY2 is now stopped, the forward movement of the mask and the substrate are not interrupted. However, the blade controller BC initiates movement of the following Y-blade Y1 as soon as the following edge EY1 is in alignment with the rear edge RE of the pattern on the moving mask. Starting with the onset of the movement of the following blade, the distance EDY between the blade edges decreases, thereby decreasing the illumination slit length to values smaller than the full illumination slit length. FIG. 3E shows an intermediate situation with stationary leading blade Y2 and moving following blade Y1. The entire exposure area EA has already received radiation energy. The portion beyond the illumination slit in movement direction has already received the entire required radiation dose, while the dose of received radiation decreases from left to right in the remaining portion which still receives radiation in the illumination slit.

Finally, as shown in FIG. 3F, the edge EY1 of the following blade Y1 moved forward in the scan direction into proximity to or contact with the stationary leading edge EY2 so that the illumination slit closes. During the closing movement the last portion of the exposure area receives decreasing amounts of radiation to such an extent that at the time of complete closing of the illumination slit, each unit area of the exposure area has received essentially the same radiation dose. This ends the scanning cycle for the exposure area EA, which has received a uniform exposure dose.

Conventionally, the next exposure area situated next to the exposed exposure area EA is then exposed in a similar manner. To this end, the substrate holder moves the substrate parallel to the cross-scan direction (perpendicular to the drawing plane) by a movement length substantially corresponding to the width of an exposure area in the cross-scan direction. This stepping operation of the substrate brings an unexposed exposure area next to the illumination slit, which is still closed at this point. A new scanning operation for the next exposure area is then initiated. In this scanning operation the mask and the substrate move in respective opposite directions compared to the scanning operation for the first exposure area explained in connection with FIG. 3. The roles of leading Y-blade and following Y-blade are reversed.

It is evident from FIG. 3 and the corresponding description that a single scan of a pattern PAT on an exposure area EA in a conventional scanning operation requires the substrate to be moved over a travel length which corresponds to the sum of the length of the exposure area in the scan direction and a length which corresponds to the full illumination slit length as it appears in the image plane of the projection objective. Due to the fact that the REMA blades close after each exposure the overall length of exposed portions in the scanning direction is smaller than the travel length. A significant amount of radiation is blocked by the blades and does not contribute to exposing the substrate. In other words: parts of the radiation which could be used for exposure is "thrown away".

Improvements with regard to the use of (expensive) light and with regard to throughput (number of completely exposed exposure areas per time unit) can be obtained if a new type of mask for microlithography and a modified mode of operation of the scanning exposure system are used.

Figure 4:
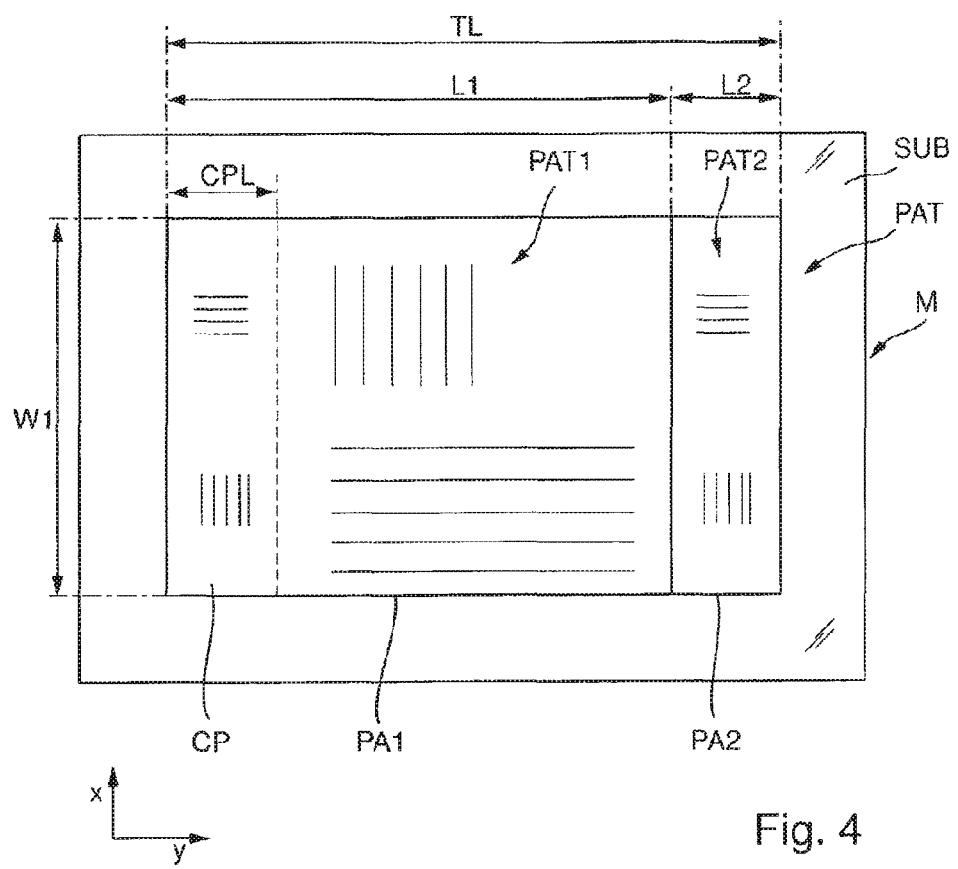
FIG. 4 shows a schematic plan view of a mask according to a first embodiment of the invention.

FIG. 4 shows a schematic plan view of a mask M according to a first embodiment of the invention. A substrate SUB of the mask has a plane substrate surface on which a pattern PAT is formed. If the mask is a transmission mask for microlithography using deep ultraviolet radiation (DUV) or vacuum ultraviolet radiation (VUV) the substrate may be made of synthetic quartz (fused silica) or calcium fluoride, for example. The pattern may be formed by chrome or other materials suitable to shield parts of the radiation passing through the mask. Alternatively, the mask may also be a phase shifting mask. The mask may be a reflective mask, which is mandatory if the mask is to be used in an EUV-system.

The mask is configured to be used in a scanning operation where the mask is scanned in a mask scanning direction parallel to the Y-direction of the projection exposure system. The pattern PAT has an overall rectangular shape with a total length TL parallel to the mask scan direction and a width W1 perpendicular thereto in the cross-scan direction. The pattern structure of the pattern may be subdivided into three pattern areas with specific function. A first pattern area PA1 extends over a first length L1 parallel to the mask scan direction and has a first width W1 perpendicular thereto. The aspect ratio L1/W1 between length and width is greater than 1 and corresponds to the aspect ratio between length and width of the corresponding exposure area (or die) which shall be exposed during a scan in the exposure process. The absolute dimensions in the length and width directions are larger than the respective dimensions of the exposure area by a factor $1/|\beta|$, where $|\beta|$ is the absolute value of the magnification ratio of the projection objective. Magnification ratio $|\beta|$ may be ¼ or ⅕, for example.

A second pattern area PA2 is formed on the substrate directly adjacent to the first pattern area PA1 in the mask scanning direction. The rectangular second pattern area extends over a second length L2 in the mask scan direction, while the second width is identical to the first width W1. The second length L2 is substantially smaller than the first length L1 so that the aspect ratio between length and width is larger than 1 in the first pattern area PA1 and smaller than 1 in the second pattern area PA2.

The second pattern PAT2 formed in the second pattern area PA2 is structurally identical to a corresponding portion CP of the first pattern PAT1 formed in the first pattern area PA1. The corresponding portion CP is offset relative to the second pattern PAT2 by the first length L1 in the mask scan direction. The corresponding portion CP has a length CPL in the scan direction which corresponds to the second length L2.

While the first pattern PAT1 corresponds to the entire structure of a layer to be formed on the exposure area, the second pattern PAT2 only corresponds to a specific fraction or partial region of the same structure. In other words: first pattern PAT1 is a complete pattern (suitable to expose a single exposure area completely), whereas the second pattern is an incomplete pattern.

The absolute dimensions of the second pattern area PA2 in this mask scan direction are adapted to correspond to the full length of the illumination slit generated by the illumination system in the mask plane of the projection exposure system in which the mask is used.

If the illumination slit is rectangular, the full length of the illumination slit corresponds to the length of a short side of the rectangle, which extends parallel to the mask scan direction. If the illumination slit has an arc shape, the full length of the illumination slit corresponds to the distance, measured in the mask scan direction, between the two arcuate borders of the illumination slit.

Absolute and relative dimensions of the pattern areas may be further understood from the following numerical example. Present state-of-the-art projection exposure systems and processes are typically adapted to expose exposure areas (dies) on a substrate which have a maximum length of 33 mm in the scanning direction. Where a projection objective with 4:1 reduction ratio is used, this length corresponds to first length L1=33×4=132 mm. On the other hand, the maximum illumination slit length measured in the plane where the pattern of the mask is situated may be between 16 mm and 32 mm, for example, corresponding to a slit length between 4 mm and 8 mm in the image plane where the substrate is arranged. Therefore, in typical cases a length ratio L1/L2 between the lengths of the first pattern area PA1 and the second pattern area PA1, respectively, may be in a range from 132/16 to 132/32, for example. In general, the condition 66 mm≤L1≤132 mm may hold for L1 and the condition 16 mm≤L2≤32 mm may hold for L2.

Figure 5:
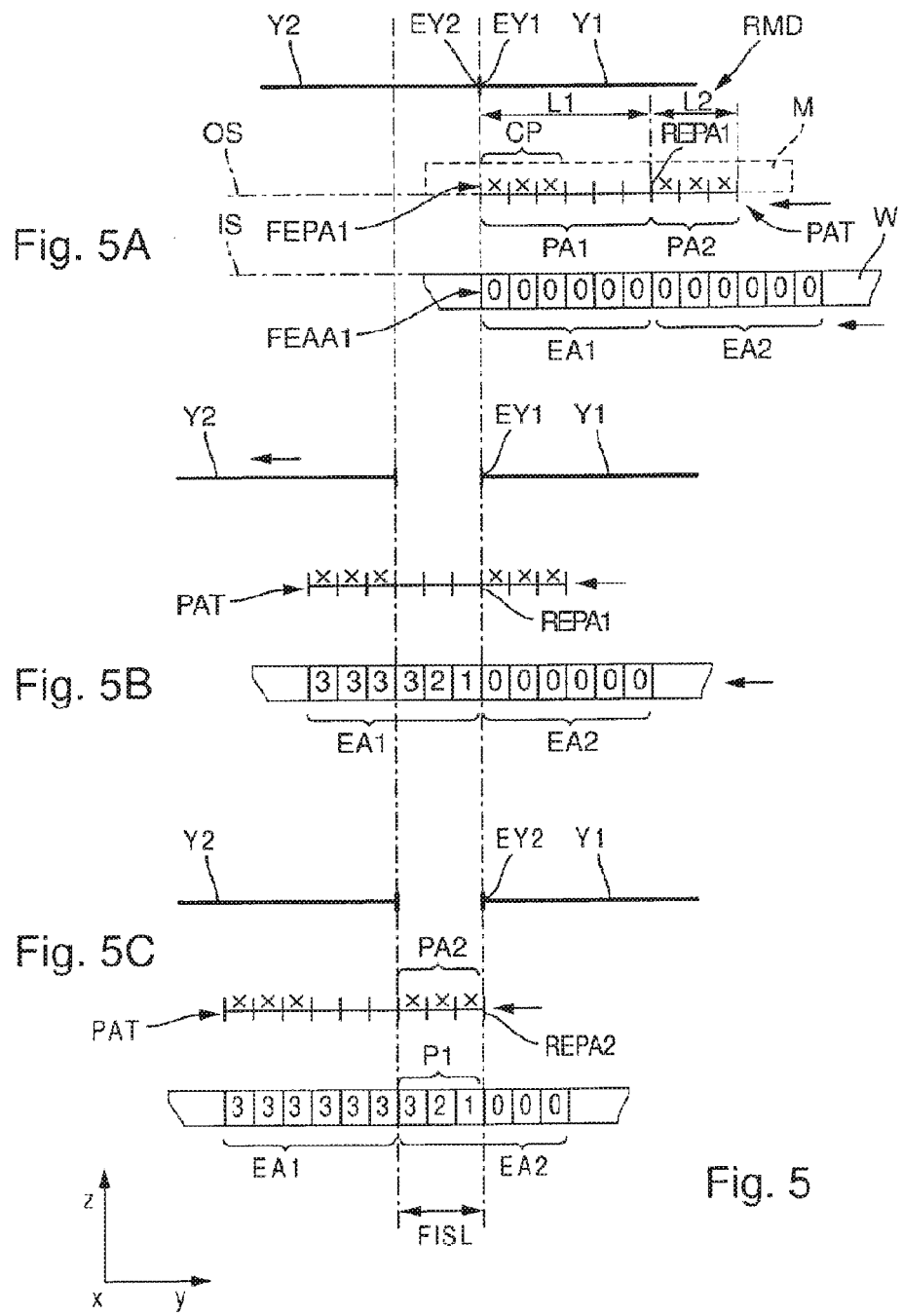
FIGS. 5A-5C shows in 5A to 5C relative positions of the blades of a reticle-masking device, a patterned mask, and the substrate in different phases of a scanning operation according to an embodiment of the invention.

A scanning process utilizing a mask in accordance with an embodiment of the invention is now described in connection with FIGS. 5 and 7. The description is partly similar to the description of the scanning process in connection with FIG. 3. Therefore, the same or similar reference identifications and terminology is used, where possible. Each of the partial FIGS. 5A to 5C shows a section of the reticle masking device RMD with Y-blades Y1, Y2, a mask M carrying a pattern PAT arranged such that the pattern is positioned in the object plane OS of the projection objective, and the substrate W in the form of a semiconductor wafer having a planar substrate surface arranged in the image plane IS of the projection objective. The Y-blades Y1, Y2 may be physically the same as the Y-blades in the conventional system of FIG. 3.

The situation shown in FIG. 5A corresponds to the situation shown in FIG. 3A, where the blade edges EY1, EY2 are in contact or so close to each other that the blades are closed and no radiation can propagate towards the mask. The mask M may have a configuration like the mask M of FIG. 4, or a variant thereof. Specifically, the pattern PAT on the mask M has a rectangular first pattern area PA1 extending in the scanning direction over first length L1, and a second pattern area PA2 directly adjacent to the first pattern area in the scanning direction. The second length L2 of the second pattern area is significantly smaller than the length L1 of the first pattern area.

The first pattern contained in the first pattern area PA1 corresponds to an entire structure of a layer to be formed on an exposure area (die) of the substrate. In contrast, a second pattern formed in the second pattern area PA2 corresponds to only a portion of this entire pattern. Specifically, the second pattern corresponds to the pattern structure of a corresponding portion CP which is offset from the second pattern and lies in the front portion of the first pattern area PA1 away from the second pattern area PA2. The portions which have identical structures are indicated with symbols "X" in the figure.

The substrate W contains a plurality of rectangular exposure areas aligned in rows parallel to the scan direction and in columns perpendicular thereto. FIG. 5 shows two exposure areas directly adjacent to each other in the scanning direction, namely the first exposure area EA1 and the second exposure area EA2. The first and second exposure areas have identical dimensions both in the length and in the width direction. As in the representation of FIG. 3, the radiation dose received in selected unit areas of the exposure areas is represented by numbers, where number "0" indicates that no radiation has been received by the respective portions in the situation shown in FIG. 5A.

FIG. 5A shows a situation right at the beginning of a scanning cycle, where the Y-blades Y1, Y2 are still closed. The mask M is in a starting position where the straight front edge FEPA1 of the first pattern area PA1 is in alignment with the edges of the blades at a position flush with the edge of the illumination slit. The illumination slit is bounded by dashed lines and has full illumination slit lengths FISL. Likewise, the substrate W is in a starting position where the front edge FEEA1 of the first exposure area is in alignment with the front edge FEPA1 of the pattern PAT. In other words: the image of the front edge FEPA1 of the pattern area PA1 falls onto the front edge FEEA1 of the first exposure area FEEA1.

As the mask M and the substrate move forward in the respective scanning directions (from right to left, see arrow) the illumination slit starts to open. Opening of the illumination slit is effected by movement of the second Y-blade Y2 in the scanning direction, while at the same time the first Y-blade Y1 remains stationary. The speed of movement of the second blade is adjusted to the movement speeds of mask and substrate such that the edge EY2 of the moving second plate Y2 stays in alignment with the front edge FEPA1 of the first pattern area until the illumination slit is fully opened so that the distance between the edges EY1, EY2 of the blades corresponds to the full illumination slit length FISL. The opening movement of the second Y-blade is then stopped, while the mask and the substrate continue to move forward in the scanning direction in a way similar to that described in connection with FIGS. 3B and 3C.

FIG. 5B shows a situation where the mask has moved forward in the scanning direction to such an extent that the rear edge REPA1 of the first pattern area PA1 is in alignment with the edge EY1 of the stationary first Y-blade Y1. This situation corresponds to the situation shown in FIG. 3D. At this time, a portion of the first exposure area EA1 adjacent to the front edge FEEA1 of the first exposure area is already fully exposed (indicated by number 3), while a remaining portion arranged in the illumination slit has received a certain dose of radiation, the dose decreasing continuously from the forward part in the scanning direction towards the rear edge REEA1 of the first exposure area. At this point in time, the second exposure area EA2 is still entirely unexposed.

In a conventional scanning cycle, the first blade Y1 (following blade) would now start to move towards the second blade Y2 with the speed corresponding to the movement speed of the substrate in order to keep the following edge EY1 in alignment with the rear edge REEA1 of the first exposure area in order to close the illumination slit and prevent any radiation from falling onto the second exposure area EA2 before the next scanning cycle starts.

However, this is not the case in the new scanning process. Instead, the new scanning process is characterized by the fact that the illumination slit remains open at this point in time while the mask and the substrate continue their respective scanning movements. As a result, the second pattern area PA2 of the mask moves into the illumination slit, while at the same time a first portion EA2-1 of the second exposure area EA2 moves forward into the illumination slit so that an image of the second pattern contained in the second pattern area PA2 is formed on the first portion P1 of the second exposure area EA2. In FIG. 5, the transition between FIGS. 5B and 5C illustrates that the illumination slit stays open at the full illumination slit length FISL while the mask and the substrate move synchronously forward so that, in the scanning cycle described in FIG. 5, the entire first exposure area EA1 and the first portion P1 of the second exposure area EA2 adjacent to the first exposure area are exposed in one single continuous first scanning operation in a first scanning direction.

Once the mask has proceeded in the scanning direction so that the rear edge REPA2 of the second pattern area is in alignment with the blade edge EY1 of the stationary following blade Y1, the forward movements of the mask M and the substrate W are stopped.

At the same time, further radiation is stopped from falling onto the open slit formed between the opposite blade edges of the reticle masking device RMD. To this end, the primary radiation source can be temporarily switched off at this point in time. Alternatively, a shutter arranged between the light source and the reticle masking device can be closed to stop any radiation from falling onto the reticle masking device. As a result, no further radiation reaches the substrate through the open slit formed between the blade edges.

In general, scanning exposure systems operating in the DUV or VUV or EUV range use pulsed radiation sources. For example, in VUV systems a pulsed laser source is typically utilized. A sequence of pulses (burst) at a given pulse rate is conventionally used to expose one exposure area. After each burst a break (time interval without pulses) is introduced to allow the stepping operation to be made before the next burst is emitted to expose the next exposure area. Intermittent operation including breaks between bursts is also favourable to avoid overheating of the light source. In the present process, emission of pulses is stopped temporarily after the burst used to expose the first exposure area and the first portion P1 of the second exposure area EA2 at the end of the scanning cycle.

In this scanning cycle, the travel length of the mask M during a single scan basically corresponds to the sum of the length of the scanned pattern contained in the first pattern area PA1 in the scanning direction and the full illumination slit length FISL in the mask plane. However, other than in a conventional scanning operation, more radiation is allowed to expose the substrate so that the entire first exposure area EA1 is uniformly and completely exposed and, in addition to that, a portion P1 of the second exposure area EA2 is also exposed, although only partly. Therefore, a ratio between the size of exposed area of the substrate and required travel length of the substrate is higher than in a conventional process.

As described, the first scanning movement is stopped before the entire second exposure area EA2 is completely exposed so that the second exposure area is only partly exposed. To further illustrate the spatial distribution of radiation dose received by respective portions on the substrate, FIG. 6 shows a schematic perspective view on a substrate surface containing two adjacent exposure areas EA1, EA2 and a diagram indicating the radiation dose D received on different locations in the scanning direction (Y-direction).

During the first scanning operation just described, the illumination slit moves relative to the substrate in the first scanning direction SD1. Note that in the actual process, the location of the illumination slit remains fixed in space, while the mask and the substrate move relative to the illumination slit in the opposite direction.

Figure 6:
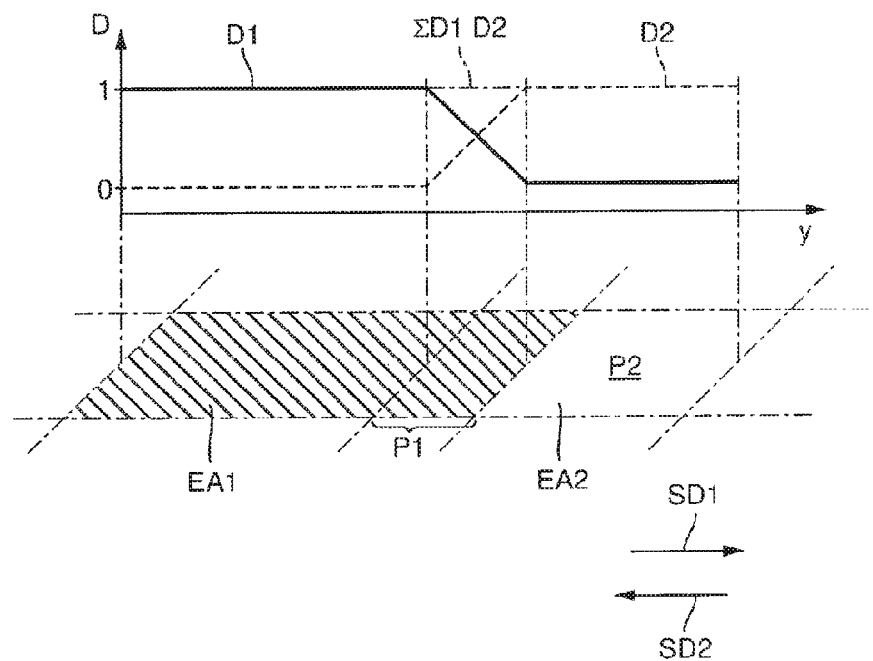
FIG. 6 shows a schematic perspective view on a substrate surface containing two adjacent exposure areas and a diagram indicating the radiation dose received on different locations in the scanning direction.

The radiation dose received during the first scanning operation is represented by the solid line D1 in FIG. 6. It is evident that the first exposure area EA1 is uniformly exposed, i.e. each location in the first exposure area has received the same radiation dose. The first portion P1 of the second exposure area EA2 has also received some amount of radiation, while the remaining second portion P2 of the second exposure area EA2 has not yet received any radiation so that the remaining portion is unexposed (not exposed) after the first scanning operation. It is evident that the radiation dose received in the first portion P1 decreases continuously (linear gradient) from the side adjacent to the first exposure area EA1 towards the second portion P2 of the second exposure area EA2 opposite to the first exposure area EA2 according to a first radiation dose profile D1.

Further operations of a step-and-scan procedure according to an embodiment of the invention are now described in connection with FIG. 7. Partial FIGS. 7A to 7G each show a schematic plan view on a portion of a substrate surface which includes a number of rectangular exposure areas arranged in rows R1, R2 etc. parallel to the scanning direction and columns C1, C2 etc. perpendicular thereto in the X-direction. As described, the substrate is moved parallel to the Y-direction in a scanning operation. A stepping operation moves the substrate perpendicular to the scan direction in X-direction to switch between different rows of exposure areas. In the schematic figures, the position of the illumination slit ILS is represented by a hedged rectangle. The location of an exposure area within an array of exposure areas can be defined by the respective row and column of the exposure area. For example, in FIG. 7A, the first exposure area EA1 in row R1 and column C1 is also denoted as R1-C1, while the adjacent second exposure area EA2 in the scanning direction is denoted R1-C2.

Figures 7, 7A, 7B, 7C, 7D, 7E:
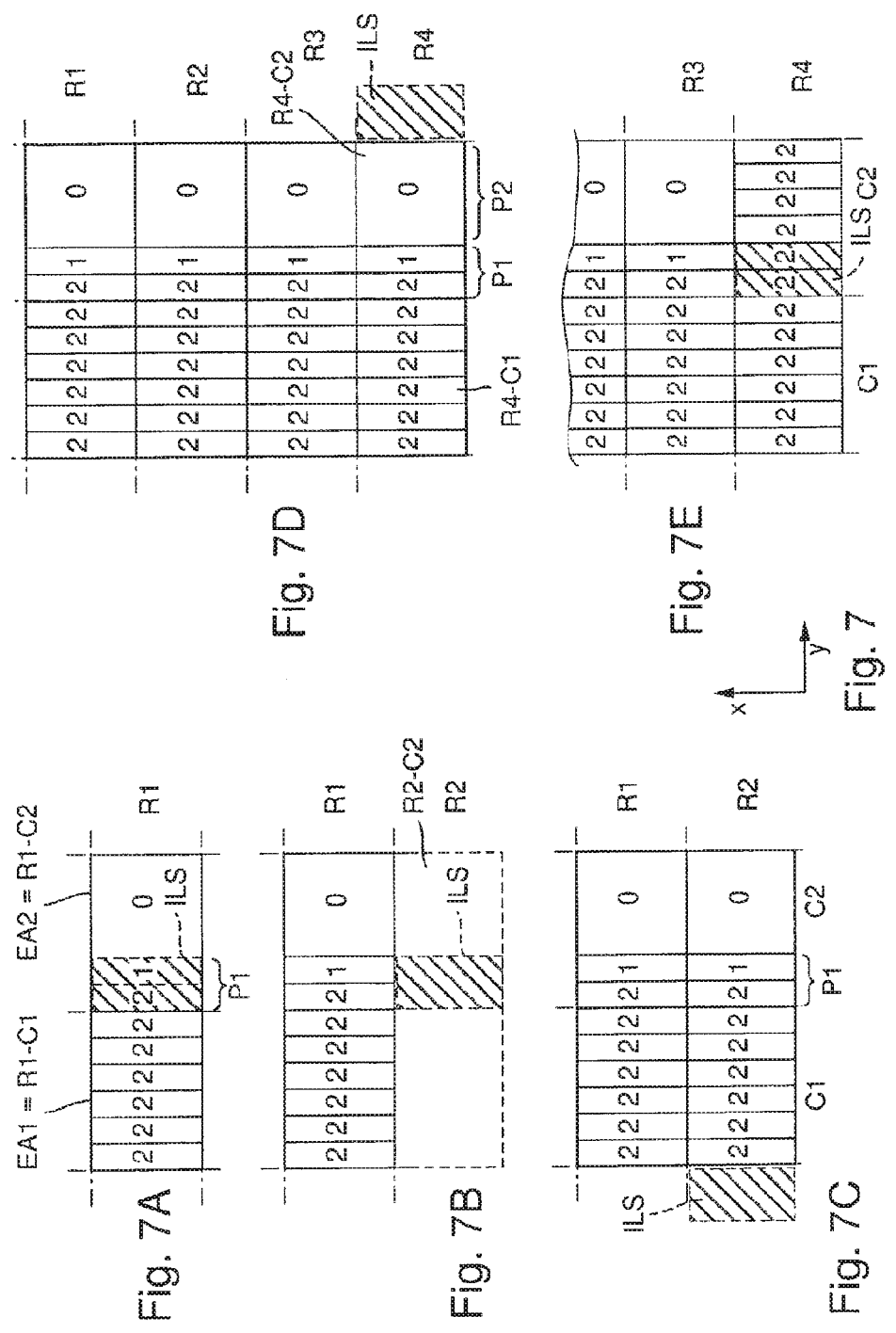

FIG. 7A shows the situation at the end of the first scanning operation described in connection with FIGS. 5 and 6. The first exposure area EA1 (R1-C1) is completely exposed (indicated by "2"). First portion P1 of the second exposure area EA2 (L1-C2) is partly exposed, while the remainder of the second exposure area is unexposed (indicated by "0"). The illumination slit ILS is on first portion P1.

At this time, i.e. at the end of a first scanning movement, the light flux on the reticle masking device is stopped, e.g. by shutting off the light source or closing a shutter arranged between lights source and reticle masking device so that no further radiation falls onto the first portion P1. Note that the Y-blades remain fully opened at full illumination slit length.

The wafer stage now performs a stepping operation so that the illumination slit ILS now falls on an adjacent exposure area R2-C2 in the second row R2 (see FIG. 7B). At this point, the next scanning operation starts by switching on the light source or opening the shutter so that light falls through the fully opened blades of the reticle masking device. The scanning operation is then performed by moving the substrate in a scanning direction opposite to the scanning direction used for the first row R1. The travel length of the scanning movement corresponds to the sum of the entire length of an exposure area plus the full illumination slit length in the scanning direction so that, after the scanning movement is stopped, the illumination slit ILS is situated right next to the completely exposed exposure area R2-C1. The first portion P1 of exposure area R2-C2 has received only a part of the required overall dose (see FIG. 7C).

A further stepping operation of the substrate parallel to the X-direction is then performed to shift the illumination slit onto an exposure area of a third row R3 directly adjacent to the second row R2. Following that, a scanning operation is performed in the same scanning direction as the scanning operation for the first row R1. Scanning operations and stepping operations alternate so that the overall movement of the substrate has a meander shape. The scanning operations of every other row of exposure areas are in the same directions, while the scanning movements for rows which are directly adjacent to each other are in the opposite directions.

Scanning and stepping operations are alternating repeated until an entire column of first exposure areas (e.g. column C1) is fully exposed, while all exposure areas in the second column C2 adjacent thereto are only partly exposed in respective first portions P1 lying adjacent to the first exposure areas.

The substrate is then moved into a starting position for a set of second scanning operations which are performed to complete the exposure of the partly exposed exposure areas of the second column C2. A starting position is shown in FIG. 7D, where the illumination slit ILS is positioned directly adjacent to the unexposed second portion P2 of exposure area R4-C2. At the beginning of the scanning cycle the illumination light is switched on (or a shutters opens) to allow radiation to pass through the opened y-blades of the reticle masking device. The substrate is then moved in the scanning direction (Y-direction) so that the illumination slit ILS moves relative to the substrate over the partly exposed exposure area R4-C2 towards the fully exposed neighbouring exposure area R4-C1.

At the end of this scanning operation (see FIG. 7E), each portion of the second exposure area R4-C2 has received the same radiation dose and is fully exposed ("2"). The light is then shut off or the shutter is closed before the substrate performs a stepping operation to bring the illumination slit ILS into the position shown in FIG. 7F in the first portion of partially exposed exposure area R3-C2. A scanning operation for this exposure area is then performed by first switching on the light (or opening the shutter) and then moving the substrate parallel to the Y-direction so that the exposure area R3-C2 is scanned in a direction opposite to the scanning direction of the neighbouring exposure area R4-C2 exposed in the previous scanning operation.

Stepping and scanning steps are then repeated alternately until all exposure areas in the second column C2 are entirely and uniformly exposed and have received the required radiation dose in every portion thereof.

The schematic plan view representations of FIG. 7 do not show in detail what happens with the exposure areas adjacent to the exposure areas in first and second columns C1, C2 discussed therein. However, it is evident that, whenever the illumination slit ILS is positioned on a portion of the substrate and is illuminated by the light source, a portion of an exposure area is partly exposed. In other words: whenever an entire exposure area is exposed in a scanning operation without closing the reticle masking blades at the end of a scanning operation, a neighbouring exposure area will be partly exposed. In the process described, this is later used to complete the exposure of the partly exposed exposure area in a subsequent second scanning operation. As shown in FIG. 7F, 7G, for example, a scanning operation need not start with the illumination slit lying outside the exposure area to be exposed. Instead, the starting position of the illumination slit may be entirely inside the exposure area to be exposed prior to the start of the scan.

It is evident from this exemplary step-and-scan-operation that each second exposure area (e.g. EA2 in FIG. 7A) will remain only partly exposed during a number of subsequent scanning operations before a second scanning operation is performed on the same second exposure area EA2. In the second scanning operation, the second exposure area EA2 is then further exposed through scanning in a second scanning direction while the exposure dose is controlled during the second scanning operation so that the second exposure area EA2 receives a radiation dose complementary to the radiation dose received in the first scanning direction so that, after the second scanning operation is completed, the second exposure area has received a uniform exposure dose corresponding to the exposure dose received in the first exposure area. The second scanning operation may be directed in a second scanning direction SD2 opposite to the first scanning direction SD1 (see FIG. 6), or in the same direction (see FIGS. 7F and 7G).

As shown in FIG. 6 the first portion P1 of the second exposure area EA2 is exposed twice, each time with a radiation dose D1 or D2 which varies in the scanning direction to generate a linear dose gradient. The gradients generated in the first and second scanning operation are complementary so that the overall dose ($\Sigma$D1D2) received corresponds to the exposure level received in single scans in the adjacent portions EA1 (dose D1) and P2 (dose D2).

Some advantages of the new process may be understood as follows. In a conventional scanning process using reticle masking blades which close after completion of a single scan, the substrate needs to be moved over the entire length of the exposure area to be exposed plus a length corresponding to the length of the illumination slit. Since the blades are closed for parts of the scanning operation, this leads to a partially light loss. Further, since a full exposure of an exposure area requires a certain amount of radiation to be received on the exposure area, a partial light loss will decrease throughput of the entire process. On the other hand, according to the new process, the blades are not closed after a scanning operation for a specific exposure area is completed. Instead, an adjacent exposure area is partly exposed. Exposure of the partly exposed exposure area is later completed in a second scanning operation which provides a complementary radiation dose profile so that the second exposure area is also completely exposed with the required radiation dose.

Advantages of the new method may be obtained using a mask basically corresponding to the mask shown in FIG. 4, having, on one side of the first pattern area PA1, a second pattern area PA2 which includes a copy of the pattern structure of corresponding portion CP. A specific sequence of scanning and stepping operations can be used to expose along rows and columns of exposure areas on a substrate, such as a semiconductor wafer.

Further degrees of freedom with regard to the required sequence of movements for the scanning and stepping operations may be obtained with another type of mask according to a second embodiment schematically shown in the plan view of FIG. 8. The mask includes a first pattern area PA1 including a first pattern PAT1, and a second pattern area PA2 including a second pattern PAT2 similar to those described in connection with FIG. 4. The respective description is therefore not repeated here. Additionally, the mask includes a third pattern area PA3 on the substrate SUB adjacent to the first pattern area PA1 in the mask scanning direction (Y-direction). The third pattern area PA3 includes a third pattern PAT3 which extends over a third length L3 in the mask scanning direction. The third width in the cross-scanning direction (X-direction) is the same as the first width of the first and second pattern areas PA1, PA2. Third length L3 corresponds to second length L2. The third pattern PAT3 is identical to a corresponding portion CP3 of the first pattern PAT1, where the corresponding portion is offset relative to the third pattern PAT3 by the first length L1 in the mask scan direction and has a length CPL3 identical to the third length L3.

In other words: the third pattern PAT3 is a copy of a portion CP3 of the first pattern PAT1 which lies adjacent to the second pattern PAT2. In general, the second pattern PAT2 and the third pattern PAT3 are not identical. However, in certain patterns, they could be identical. A mask having copies of corresponding portions of the original PAT1 on both sides of the original pattern PAT1 allows more flexibility with regard to the required sequence of scanning and stepping operations in order to complete the exposure for an entire substrate.

Some embodiments of the invention have been described in great detail above. However, the disclosure is not limited to these embodiments. For example, other primary radiation sources may be used in other embodiments, for example emitting at about 248 nm, 157 nm or 126 nm Radiation sources for the extreme ultraviolet (EUV) spectral range may also be utilized in connection with purely reflective (catoptric) optical systems and reflective masks. An embodiment for EUV lithography is described in connection with FIG. 9.

Figure 9:
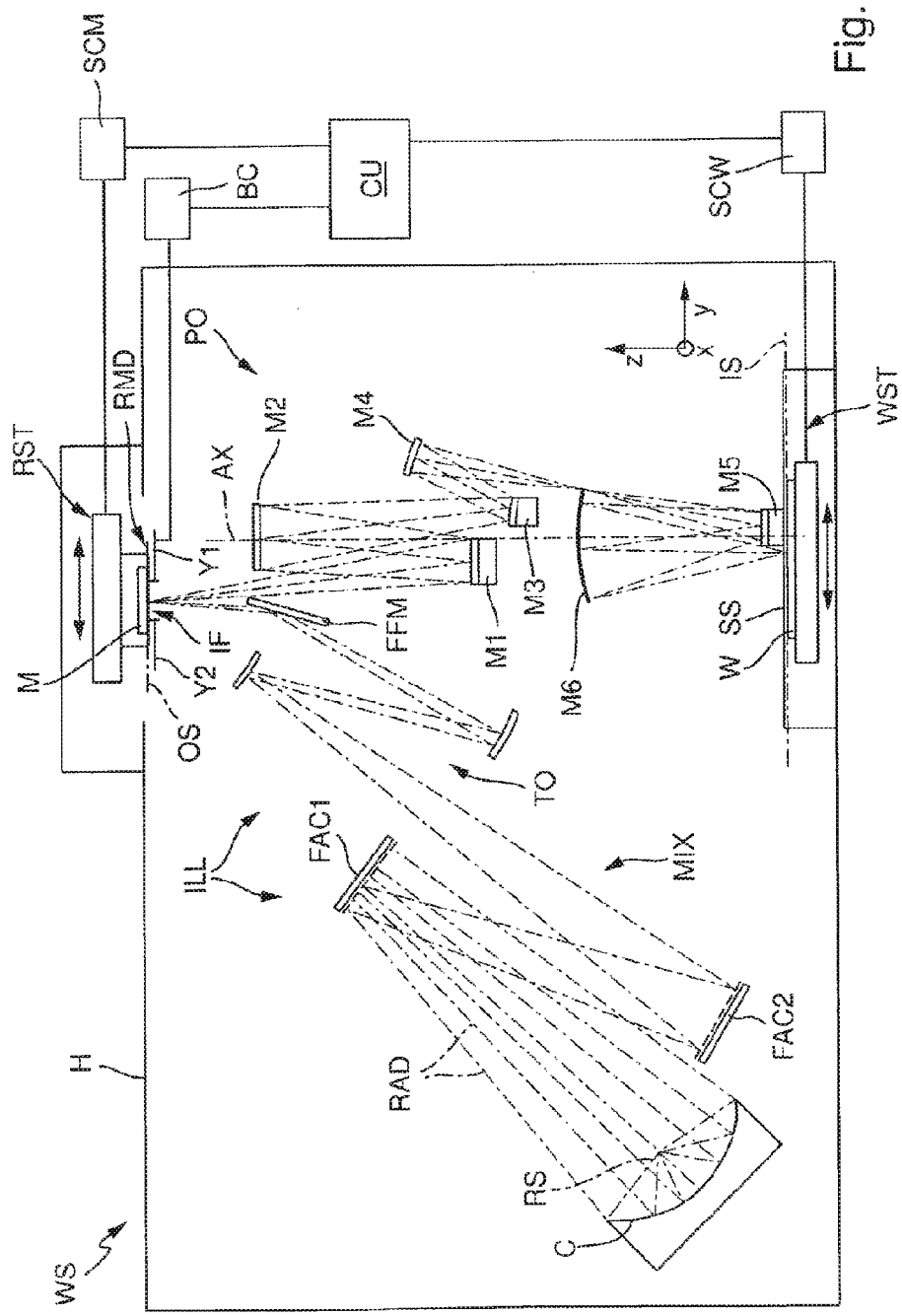
FIG. 9 shows a schematic drawing of an embodiment of a scanning projection exposure system for EUV microlithography having an illumination system which includes a reticle masking device directly in front of a reflective mask.

FIG. 9 shows schematically components of a EUV microlithography projection exposure system in the form of a wafer scanner WS for fabricating large scale integrated semiconductor components via projection lithography in a step-and-scan mode.

The projection exposure system comprises a primary radiation source RS emitting radiation in the extreme ultraviolet (EUV) spectral range. The primary radiation source may be a laser plasma source or a gas discharge source or a radiation source using synchrotron radiation. The EUV radiation source may provide primary radiation at wave lengths between 5 nm and 15 nm, for example. Since EUV radiation cannot be influenced by refractive optical elements, all optical elements of the illumination system ILL and the projection objective PO are reflective optical elements.

Primary radiation RAD emitted from radiation source RS is collected by collector C and guided into the illumination system ILL. The illumination system includes a mixing unit MIX, a telescope optical system TO and a field forming mirror FFM. The illumination system forms radiation and illuminates an illumination field IF which is positioned in the object plane OS of the projection objective or in the immediate vicinity thereof. The illumination field is generally slit shaped and may have a rectangular shape or an arc shape. The mixing unit MIX consists of a first facetted mirror FAC1 and a second facetted mirror FAC2 downstream thereof. The first facetted mirror is in a position optically conjugate to the object plane OS of the projection objective. The second facetted mirror FAC2 is arranged in a pupil plane of the illumination system, which is optically conjugate to the pupil plane of the projection objective. Radiation from the single facets of the first facetted mirror FAC1 is imaged into the object plane of the projection objective by the optical imaging subsystem which includes the second facetted mirror FAC2, the components of the telescope optical system TO and the field forming mirror FM operated at grazing incidence. The spatial intensity distribution at the first facetted mirror therefore determines the spatial intensity distribution in the illumination field IF. The spatial intensity distribution at the second facetted mirror FAC2 determines the distribution of illumination angles in the illumination field IF.

During operation of the system, a reflective mask M is arranged at or near the object plane OS of the projection objective such that a pattern formed on or generated by the mask is positioned in the object plane OS. The projection objective PO is a catoptric (all reflective) projection objective and comprises a total of six curved mirrors M1 to M6 to image the pattern PAT of the mask onto the radiation sensitive substrate surface SS of the substrate W.

The reduction projection objective PO is designed to image an image of the pattern mask M with a 4:1 reduction scale (magnification $|\beta|=0.25$) onto a photosensitive substrate. Other reduction ratios, e.g. 5:1 or 8:1 are possible.

A device RST for holding and manipulating a mask M is arranged downstream of the illumination system is in such a way that a pattern lies in the object plane OS of the projection objective PO. Therefore, the object plane may also be denoted as "mask plane" or "reticle plane". The device RST for holding and manipulating the mask—usually referred to as "reticle stage"—contains a mask holder and a scanner drive SCM enabling the mask to be moved parallel to the object plane OS of the projection objective (i.e. perpendicular to a reference axis AX of projection objective) in a scanning direction (Y-direction) during a scanning operation.

The light-sensitive substrate W is arranged in such a way that a macroscopically planar substrate surface SS with the photoresist layer essentially coincides with the image plane IS of the projection objective. The wafer is held by a device WST (wafer stage) comprising a scanner drive SCW in order to move the wafer synchronously with the mask M in parallel with the latter.

All optical components of the exposure system are contained in an evacuated housing H so that operation of the projection system is performed under vacuum.

EUV microlithographic projection exposure systems having this general construction are shown for example in WO 2009/100856 A1 or WO 2010/049020 A1. The disclosure of these documents is incorporated herein by reference.

A reticle-masking device RMD provided to define the effective length and width dimensions of an illumination slit on the reflective mask M at a given instant of time includes two pairs of movable light blocking blades (REMA blades), which are arranged immediately in front of the patterned reflective side of the mask M. A plan view may be similar to that shown in FIG. 2. The Y blades Y1 and Y2 each movable parallel to the y direction of the system are shown schematically in FIG. 9. Movement is controlled by blade controller BC connected to or part of the central control unit CU of the system. A distance between the blades and the patterned surface of the mask may be in the order of one or two millimeters or less so that shadows of the blade edges EY1, EY2 formed on the mask in the object plane OS sharply delimit the illumination slit on the mask in the Y direction. The same holds for the X-blades in the orthogonal X direction. Therefore, because there is no imaging optical system (relay system) between the blades of the reticle-masking device and the mask, a projection of the aperture bounded by the edges of the reticle masking blades falls onto the mask to form the illumination slit.

Other embodiments of EUV projection exposure systems may include a catoptric relay optical system between the blades of the reticle-masking device and the mask. EUV projection systems having this general configuration are shown in US 2002/0054660 A1, for example.

The pattern of the mask M is configured according to an embodiment of the present invention. Specifically the pattern may be configured in accordance with the description in connection with FIG. 4 or FIG. 8. The respective portions of the description are incorporated herein to describe the pattern structure of the reflective mask. Coordinated operation of the blades of the reticle masking device and the moving mask and substrate may be the same or similar as the operation described in connection with FIGS. 5 to 7.

The invention claimed is:

1. A mask for microlithography comprising:
a substrate;
a first pattern area supported by the substrate, the first pattern area comprising a first pattern extending over a first length in a mask scanning direction and a first width in a direction perpendicular to the mask scanning direction;
a second pattern area supported by the substrate, the second pattern area being adjacent to the first pattern area in the mask scanning direction, the second pattern area comprising a second pattern extending over a second length in the mask scanning direction and a second width identical to the first width in the direction perpendicular to the mask scan direction,
wherein the second length is less than the first length, the second pattern is identical to a corresponding portion of the first pattern, the corresponding portion of the first pattern is offset relative to the second pattern by the first length in the mask scanning direction, and a length of the corresponding portion in the mask scanning direction is identical to the second length.

2. The mask according to claim 1, wherein:
L1 is the first length;
L2 is the second length;
66 mm≤L1≤132 mm;
6 mm≤L2≤32 mm hold; and
L1/L2 is from 132/16 to 132/32.

3. The mask according to claim 2, further comprising a third pattern area on the substrate, wherein:
the third pattern area is adjacent to the first pattern area in the mask scanning direction;
the first pattern area is between the second and third pattern areas in the mask scanning direction;
the third pattern area comprises a third pattern extending over a third length in the mask scanning direction;
the third pattern has a third width identical to the first width in the direction perpendicular to the mask scan direction;
the third length is less than the first length;
the third pattern is identical to a corresponding portion of the first pattern;
the corresponding portion is offset relative to the third pattern by the first length in the mask scanning direction; and
a length of the corresponding portion in the mask scanning direction is identical to the third length.

4. The mask according to claim 3, wherein the second length is the same as the third length.

5. The mask according to claim 1, wherein the mask is a reflective mask.

6. The mask according to claim 1, wherein the mask is a transmission mask.

7. A system, comprising:
a mask according to claim 1;
an illumination system configured to illuminate the mask; and
a projection objective configured to project the mask into an image plane.

8. The mask according to claim 1, further comprising a third pattern area on the substrate, wherein:
the third pattern area is adjacent to the first pattern area in the mask scanning direction;
the first pattern area is between the second and third pattern areas in the mask scanning direction;
the third pattern area comprises a third pattern extending over a third length in the mask scanning direction;
the third pattern has a third width identical to the first width in the direction perpendicular to the mask scan direction;
the third length is less than the first length;
the third pattern is identical to a corresponding portion of the first pattern;
the corresponding portion is offset relative to the third pattern by the first length in the mask scanning direction; and
a length of the corresponding portion in the mask scanning direction is identical to the third length.

9. The mask according to claim 8, wherein the second length is the same as the third length.

* * * * *